(12) United States Patent
Jannu et al.

(10) Patent No.: US 12,288,891 B2
(45) Date of Patent: *Apr. 29, 2025

(54) MOBILE SWAPPABLE BATTERY FOR A POWERED WORKSTATION

(71) Applicant: Green Cubes Technology, LLC, Kokomo, IN (US)

(72) Inventors: Vijayendra Jannu, Bangalore (IN); Peter Hsiao, Taipei (TW); Mohammed Alobaidi, Kokomo, IN (US); Goo Sung, Everett, WA (US); Calvin Ting, Kokomo, IN (US)

(73) Assignee: Green Cubes Technology, LLC, Kokomo, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,255

(22) Filed: May 2, 2023

(65) Prior Publication Data

US 2024/0332708 A1 Oct. 3, 2024

Related U.S. Application Data

(63) Continuation of application No. 16/596,724, filed on Oct. 8, 2019, now Pat. No. 11,715,858.
(Continued)

(51) Int. Cl.
| | |
|---|---|
| *H01M 50/24* | (2021.01) |
| *H01M 10/0525* | (2010.01) |
| *H01M 10/657* | (2014.01) |
| *H01M 50/103* | (2021.01) |
| *H01M 50/247* | (2021.01) |
| *H02H 5/04* | (2006.01) |

(Continued)

(52) U.S. Cl.
CPC ..... *H01M 50/247* (2021.01); *H01M 10/0525* (2013.01); *H01M 10/657* (2015.04); *H01M 50/103* (2021.01); *H02H 5/041* (2013.01); *H02H 7/18* (2013.01); *H05K 5/0256* (2013.01)

(58) Field of Classification Search
CPC .. H01M 50/20; H01M 50/202; H01M 50/204; H01M 50/233; H01M 50/247; H01M 50/103; H01M 50/262; H01M 50/258; H01M 50/269; H01M 50/10; H01M 10/0525; H01M 10/052; H02H 5/041; H02H 7/18; H05K 5/0256; H05K 5/0208
See application file for complete search history.

(56) References Cited

U.S. PATENT DOCUMENTS

| | | | |
|---|---|---|---|
| 11,715,858 B1 * | 8/2023 | Jannu | H02H 7/18 429/100 |
| 2003/0102969 A1 * | 6/2003 | Parsons | B62B 3/1404 340/568.5 |

(Continued)

*Primary Examiner* — Raymond Alejandro
(74) *Attorney, Agent, or Firm* — Reichel Stohry Dean LLP; Mark C. Reichel; Natalie J. Dean

(57) ABSTRACT

Mobile swappable battery for a powered workstation. In an embodiment of a mobile swappable battery sized for detachable coupling with a base of a powered workstation of the present disclosure, the battery comprises a wheeled housing enclosing a portion of the battery, wherein the wheeled housing comprises at least two wheels attached to a bottom side of the housing, and a collapsible handle for pushing and guiding the wheeled housing into detachable alignment with a battery guide in the base of the powered workstation.

19 Claims, 10 Drawing Sheets

Related U.S. Application Data

(60) Provisional application No. 62/742,568, filed on Oct. 8, 2018.

(51) Int. Cl.
*H02H 7/18* (2006.01)
*H05K 5/02* (2006.01)

(56) References Cited

U.S. PATENT DOCUMENTS

| | | | |
|---|---|---|---|
| 2012/0160576 A1* | 6/2012 | Anasiewicz | B62B 3/02 180/19.1 |
| 2012/0248719 A1* | 10/2012 | Rossini | A61G 12/001 280/29 |
| 2014/0292524 A1* | 10/2014 | Nallabelli | H01M 10/4257 340/636.1 |
| 2016/0001828 A1* | 1/2016 | Cates | B62B 13/18 180/9.22 |
| 2020/0287392 A1* | 9/2020 | Cooper | H02J 1/001 |

* cited by examiner

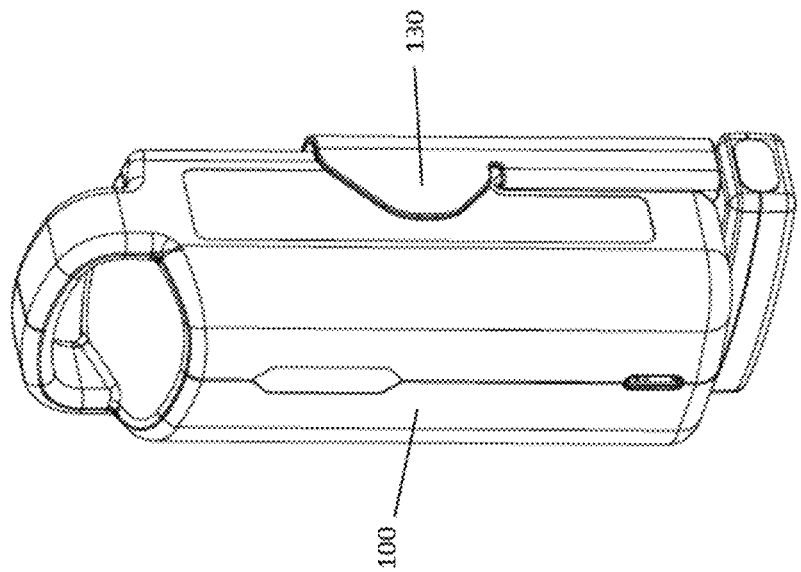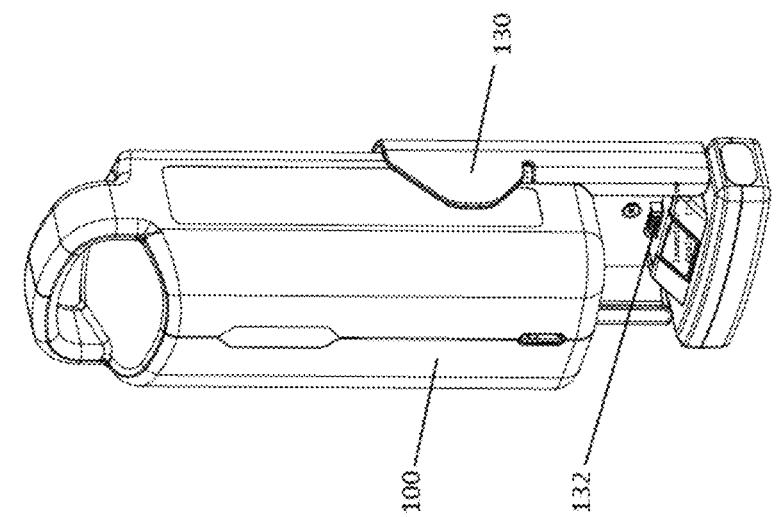

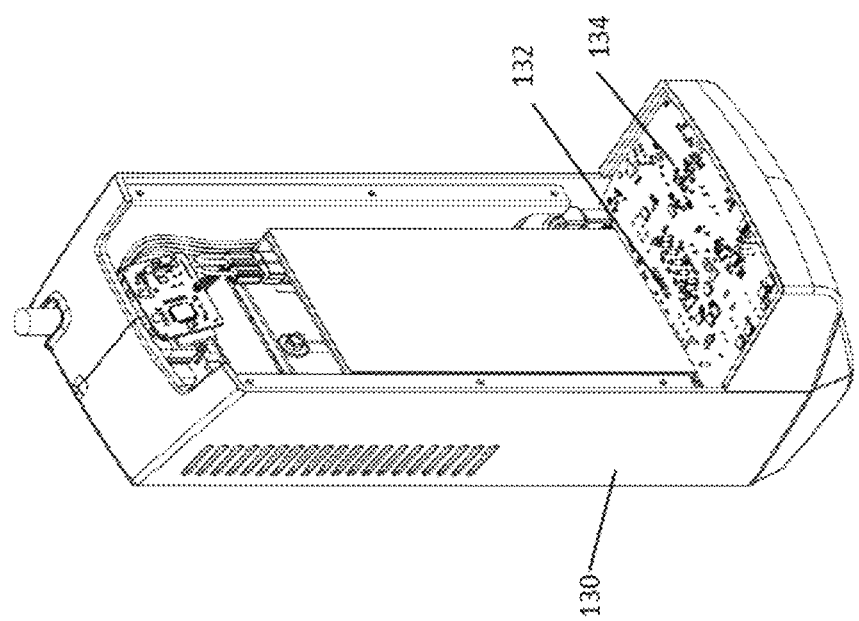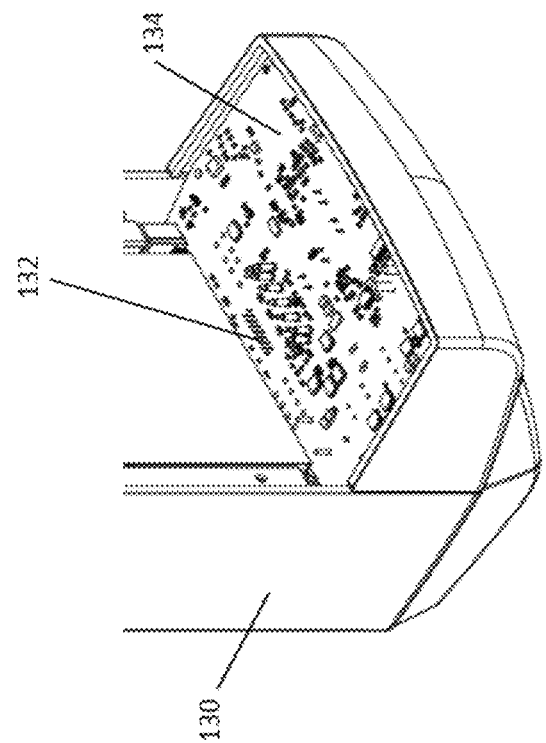

MOBILE SWAPPABLE BATTERY FOR A POWERED WORKSTATION

PRIORITY & RELATED APPLICATIONS

The present application is related to, and claims the priority benefit of, and is a U.S. continuation patent application of, U.S. patent application Ser. No. 16/596,724, filed on Oct. 8, 2019 and issued as U.S. Pat. No. 11,715,858 on Aug. 1, 2023, which is related to, and claims the priority benefit of, U.S. Provisional Patent Application Ser. No. 62/742,568, filed Oct. 8, 2018, the contents of which are incorporated into the present disclosure in their entirety.

BACKGROUND

Hospitals and warehouses must operate around the clock and they rely on battery powered mobile workstations to maintain their constant operations. Having a reliable battery powered mobile workstation is paramount for maintaining productivity and efficiency twenty-four hours a day.

Currently, battery powered workstations are configured in one of two ways, either: 1) the battery is fixed on the cart, so in order to charge the battery the whole cart must be moved and plugged in to recharge the battery; and/or 2) the battery can be swapped by hand, however the battery has to be lightweight for the operator, lest it be too heavy for them to move. The weight of the battery limits how much charge it can hold/maintain and often it needs to be replaced every few hours. Often, workers are required to return to an office or storage area to retrieve a new fully charged battery and then kneel down on the floor to maneuver the battery into position at the base of the workstation cart. It is an inefficient waste of employee time to push the powered workstation cart back to an office or other storage location to retrieve a fully charged battery, kneel down and replace the battery, and then push the battery powered workstation cart back to the work area again.

To maintain efficiency and reliability of workstation operations, the battery in the battery powered mobile workstations must be easily replaceable and hold/maintain enough energy or charge to last at least one shift. It would certainly be desirable to have a mobile battery, such as a battery on wheels that could be pushed directly to the powered workstation's location for more efficient battery replacement when needed. Having a powered workstation with a more easily swappable mobile battery would be very advantageous and would greatly reduce downtime of a battery powered workstation cart, especially if it can hold enough energy for a full shift.

When batteries are swapped there is a potential for the battery to be improperly placed and/or for dirt or liquids to obstruct the exposed battery connection contacts. When the battery is improperly positioned or when the exposed battery connection contacts become obstructed, the battery may overheat and eventually destroy the battery and/or the battery connection system. Thus, it would be desirable to sense or monitor the temperature of the exposed battery connection contacts to shut the system down should the temperature rise too high, thus saving the battery and/or battery connection system.

BRIEF SUMMARY

In at least one exemplary embodiment of a mobile swappable battery sized for detachable coupling with a base of a powered workstation of the present disclosure, the battery comprises a wheeled housing enclosing a portion of the battery, wherein the wheeled housing comprises at least two wheels attached to a bottom side of the housing, and a collapsible handle for pushing and guiding the wheeled housing into detachable alignment with a battery guide in the base of the powered workstation.

In at least one exemplary embodiment of a mobile swappable battery sized for detachable coupling with a base of a powered workstation of the present disclosure, the battery is a rechargeable lithium battery.

In at least one exemplary embodiment of a mobile swappable battery sized for detachable coupling with a base of a powered workstation of the present disclosure, the at least two wheels comprises three wheels attached to the bottom side of the housing.

In at least one exemplary embodiment of a mobile swappable battery sized for detachable coupling with a base of a powered workstation of the present disclosure, at least one of the three wheels is a front wheel configured to swivel 360 degrees.

In at least one exemplary embodiment of a mobile swappable battery sized for detachable coupling with a base of a powered workstation of the present disclosure, the front wheel configured to swivel 360 degrees is a caster wheel.

In at least one exemplary embodiment of a mobile swappable battery sized for detachable coupling with a base of a powered workstation of the present disclosure, the wheeled housing further comprises a mechanical locking mechanism to lock the battery into place in the base of the powered workstation.

In at least one exemplary embodiment of a mobile swappable battery sized for detachable coupling with a base of a powered workstation of the present disclosure, the wheeled housing further comprises an electrical locking mechanism to lock the battery into place in the base of the powered workstation.

In at least one exemplary embodiment of a mobile swappable battery sized for detachable coupling with a base of a powered workstation of the present disclosure, the collapsible handle collapses to lie flat against the wheeled housing.

In at least one exemplary embodiment of a mobile swappable battery sized for detachable coupling with a base of a powered workstation of the present disclosure, the collapsible handle is configured to collapse such that an upper portion of the collapsible handle contacts the wheeled housing.

In at least one exemplary embodiment of a method of swapping a battery in a base of a powered workstation, the method comprises the steps of guiding a wheeled housing into alignment with a base portion of a powered workstation, the wheeled housing comprising a battery, at least two wheels attached to a bottom side of the wheeled housing, and a collapsible handle for pushing and guiding the wheeled housing into detachable alignment with a battery guide in the base of the powered workstation, and pushing the wheeled housing into the battery guide in the base portion of the powered workstation to connect the wheeled housing with the powered workstation.

In at least one exemplary embodiment of a method of swapping a battery in a base of a powered workstation, the method further comprises the step of extending the collapsible handle before guiding the wheeled housing into alignment with the base portion of the powered workstation.

In at least one exemplary embodiment of a method of swapping a battery in a base of a powered workstation, the method further comprises the step of collapsing the collapsible handle to lie flat against the wheeled housing.

In at least one exemplary embodiment of a method of swapping a battery in a base of a powered workstation, the method In at least one exemplary embodiment of a method of swapping a battery in a base of a powered workstation, the wheeled housing further comprises a third wheel attached to the bottom side of the wheeled housing, wherein at least one of the at least two wheels or the third wheel is a front wheel configured to swivel 360 degrees, and wherein the step of guiding is performed by guiding the wheeled housing whereby the front wheel swivels to aid in guiding the wheeled housing into alignment with the base portion of the powered workstation.

In at least one exemplary embodiment of a method of swapping a battery in a base of a powered workstation, the wheeled housing further comprises a mechanical locking mechanism configured lock the battery into place in the base of the powered workstation.

In at least one exemplary embodiment of a method of swapping a battery in a base of a powered workstation, the wheeled housing further comprises an electrical locking mechanism to lock the battery into place in the base of the powered workstation, and wherein the step of pushing is performed to lock the battery into place within the mechanical locking mechanism.

In at least one exemplary embodiment of a battery docking connector of the present disclosure, the connector comprises exposed battery contacts, and a circuit sensor electrically coupled to the exposed battery contacts for sensing a temperature at the exposed battery contacts, and wherein the circuit sensor switches off an electrical load once a threshold temperature has been reached, so to prevent overheating of a battery providing power to the electrical load In at least one exemplary embodiment of a temperature sensing system for a battery docking connector of the present disclosure, the system comprises a microcontroller, a step down controller, and a battery each electrically coupled together, and a circuit sensor electrically coupled to the battery for sensing a temperature at the battery, wherein the microcontroller reduces battery charging current if the sensed temperature crosses a first predetermined threshold temperature, and wherein the microcontroller turns off the battery charging current if the sensed temperature crosses a second predetermined threshold temperature to prevent overheating.

In at least one exemplary embodiment of a temperature sensing system for a battery docking connector of the present disclosure, the microcontroller reduces battery charging current via the step down controller if the sensed temperature crosses the first predetermined threshold temperature.

In at least one exemplary embodiment of a temperature sensing system for a battery docking connector of the present disclosure, the microcontroller further comprises a Digital to Analog Converter (DAC) Pin, and wherein the DAC Pin is used to set analog voltage to control battery current levels.

In at least one exemplary embodiment of a temperature sensing system for a battery docking connector of the present disclosure, the step down controller further comprises a CTRL Pin, and wherein battery charging current is set by analog voltage on the CTRL Pin.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein:

FIG. 5 illustrates an exemplary battery being pushed into proper alignment with a battery docking/connector (and approaching contact with exposed battery connection contacts);

FIG. 6 illustrates an exemplary battery properly coupled to a battery docking/connector;

FIGS. 7 and 8 illustrate the exposed battery connection contacts and the underlying printed circuit board of the battery docking/connector;

Figure 1:
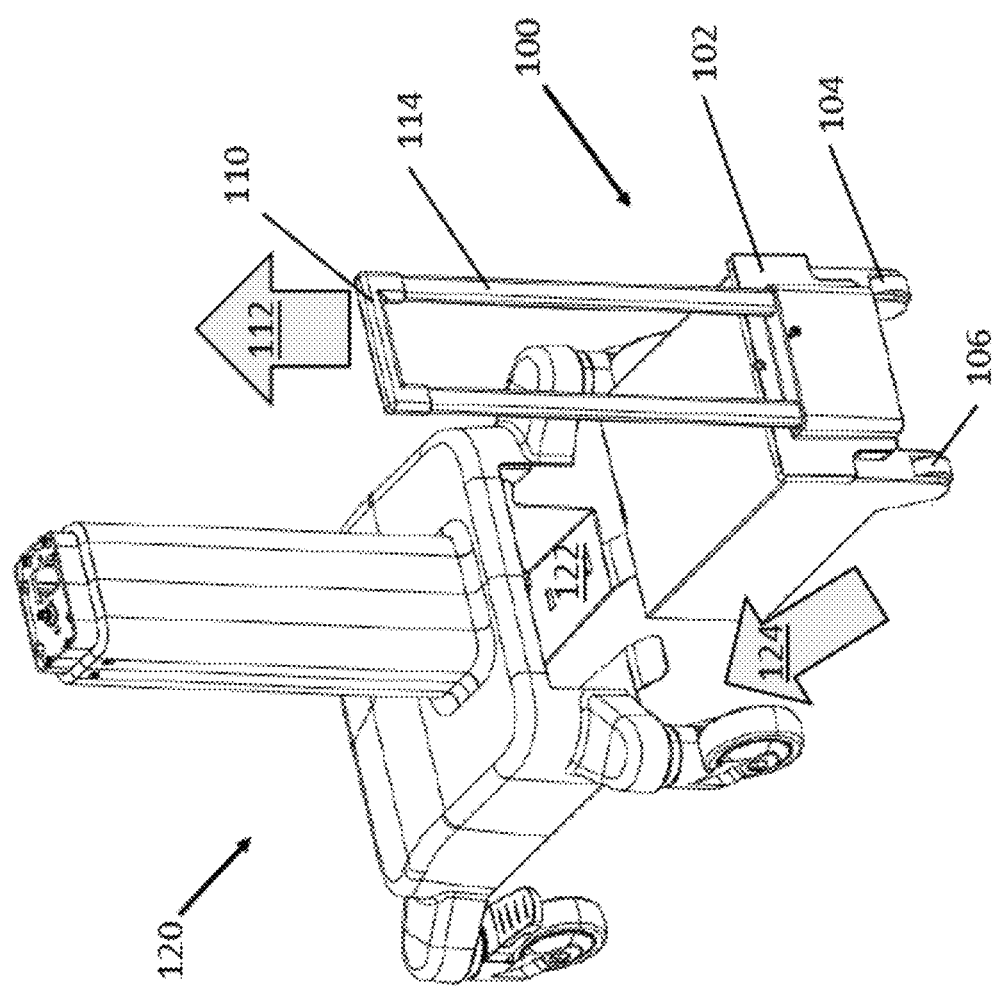
FIG. 1 illustrates a perspective view of a first embodiment of a mobile swappable battery being pushed into a powered workstation cart.

As such, an overview of the features, functions and/or configurations of the components depicted in the various figures will now be presented. It should be appreciated that not all of the features of the components of the figures are necessarily described and some of these non-discussed features (as well as discussed features) are inherent from the figures themselves. Other non-discussed features may be inherent in component geometry and/or configuration. Furthermore, wherever feasible and convenient, like reference numerals are used in the figures and the description to refer to the same or like parts or steps. The figures are in a simplified form and not to precise scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The present disclosure includes various mobile/swappable batteries for mobile battery powered workstation, systems, and methods for swapping the battery in a mobile battery powered mobile workstation.

In a first embodiment, as shown in FIG. 1, a mobile swappable battery 100 is sized specifically for operation with a mobile battery powered workstation 120. The mobile swappable battery 100 may be a rechargeable, such as a rechargeable lithium battery. However, it should be understood that other batteries may be used herein consistent with the scope of the present invention.

Battery 100 may be housed within a secure and lockable wheeled housing 102, to prevent theft and damage and to make the battery 100 more easily swappable. The battery 100 may comprise a lithium battery 100 operably coupled to the electronic components of the powered workstation 120 to provide power. The lithium battery 100 may be large enough to provide battery power for at least one employee shift, or approximately 8 hours. The lithium battery 100 can be recharged, such as by plugging it into a wall outlet and/or by replacing the battery 100 with another fully charged battery 100. Employees can recharge and/or replace batteries 100 between shifts and battery life is anticipated to be long.

As shown in FIG. 1, the mobile swappable battery 100, such as a rechargeable lithium battery, may be securely enclosed in a wheeled housing 102. The wheeled housing 102 enclosing at least a portion of the mobile swappable battery 100 may help to protect the battery from damage during maneuvering and may help a user to maneuver it into position more easily. The wheeled housing 102 may enclose a substantial portion of the battery 100 and may have two (or more) rear wheels 104, 106 attached to the bottom side. In this embodiment, the two rear wheels 104, 106 may largely support the weight of the heavy rechargeable lithium battery 100 and housing 102 and operate to help a user more easily roll the heavy housing 102 into the proper position. In some embodiments, the wheels 104, 106 may be fixed, but in other embodiments, one or both wheels 104, 106 may swivel to provide better steering.

FIG. 1 shows the housing 102 having three wheels 104, 106, and 108 for exemplary purposes of illustration herein, but it should be understood that third wheel 108 is optional, and that this embodiment may only comprise two wheels 104 and 106, or alternatively, may comprise more than three wheels 104, 106, 108. It should be understood that a wheeled housing 102 having two wheels 104, 106, and a wheeled housing 102 having three wheels 104, 106, and 108, are both anticipated as being within the scope of the present invention.

In some embodiments, the wheeled housing 102 may further comprise a third wheel 108, such as a front wheel 108 attached to the bottom side. The front wheel 108 may be a fixed wheel or may be a front guiding swivel wheel. In one embodiment, the front guiding swivel wheel 108 may be designed to both support weight, and swivel 360 degrees, thus steering the mobile swappable battery 100. The wheels or casters 104, 106, 108, allow a user to easily push and guide the mobile swappable battery 100 into position. In some embodiments, the front guiding swivel wheel 108 may be a caster wheel, for example. In other embodiments, all three wheels 104, 106, and 108 may be caster wheels. In other embodiments, there may be more than three wheels attached to the bottom side of housing 102.

The mobile swappable battery 100 may further comprise an extendable handle 110. The handle 110 extends upward (in the direction of arrow 112 in FIG. 1) from wheeled housing 102. The handle 110 may be formed of several collapsible segments 114, so that the handle may be collapsed down into the wheeled housing 102 when not in use. When handle 110 is collapsed, it may lie flat against wheeled housing 102, or may extend just a few inches above the wheeled housing 102, as shown in FIG. 1. However, the handle 110 may also be extended upward in the direction of arrow 112 by a user, to push and guide the mobile swappable battery 100 into the proper position, i.e. alignment with powered workstation 120 (shown as direction of arrow 124).

As shown in FIG. 1, a user would push and/or guide the mobile swappable battery 100, using handle 110, into alignment with a battery guide 122 built into the base of the mobile battery powered workstation cart 120 (i.e., in the direction of arrow 124). The mobile swappable battery 100 will slide into the battery guide 122 (in the direction of arrow 124) in the base of the powered workstation 120 to operably couple the battery 100 to the powered workstation 120. The wheeled housing 102 makes it much easier for a user to swap a battery 100 in the base of the powered workstation 120. The user no longer has to kneel down to maneuver a heavy and awkward battery into proper alignment with the base of the powered workstation 120, as the handle 110, and wheeled housing 102, will allow a user to remain standing while rolling and guiding the swappable battery 100 into position within the base of the powered workstation 120. Furthermore, users can now easily and efficiently move the mobile swappable battery 100 directly to the location of the powered workstation 120, thus increasing work efficiency.

The mobile swappable battery 100 may also be designed to slide into, and lock into, the battery guide 122 in the base of the powered workstation 120. In this embodiment, the mobile swappable battery 100 will lock into position in the base of the powered workstation 120, so that it cannot accidentally become loose, or lose electrical connectivity (i.e., power), from the powered workstation 120 during operation. In some embodiments, the locking mechanism (not shown) may be a mechanical lock. In other embodiments, the locking mechanism may be an electrical lock. Both mechanical and/or electrical battery locking mechanisms are anticipated as being within the scope of the present invention.

As shown in FIG. 1, the wheels 104, 106, 108 of the mobile swappable battery 100 are sized to be of appropriate height to align with battery guide 122 on the base of the powered workstation 120. In this manner, the user does not need to lift the heavy mobile swappable battery 100, as it is already at the correct height and it can just be pushed and guided into proper alignment with battery guide 122 in the base of powered workstation 120 (i.e., in the direction of arrow 124). Additionally, while the wheeled housing 102 may enclose a portion of the mobile swappable battery 100 to prevent damage, it should be understood that some portions of the battery, such as electrical contact elements must necessarily be exposed for electrically coupling to powered workstation 120 when received and locked within the battery guide 122.

Figure 2:
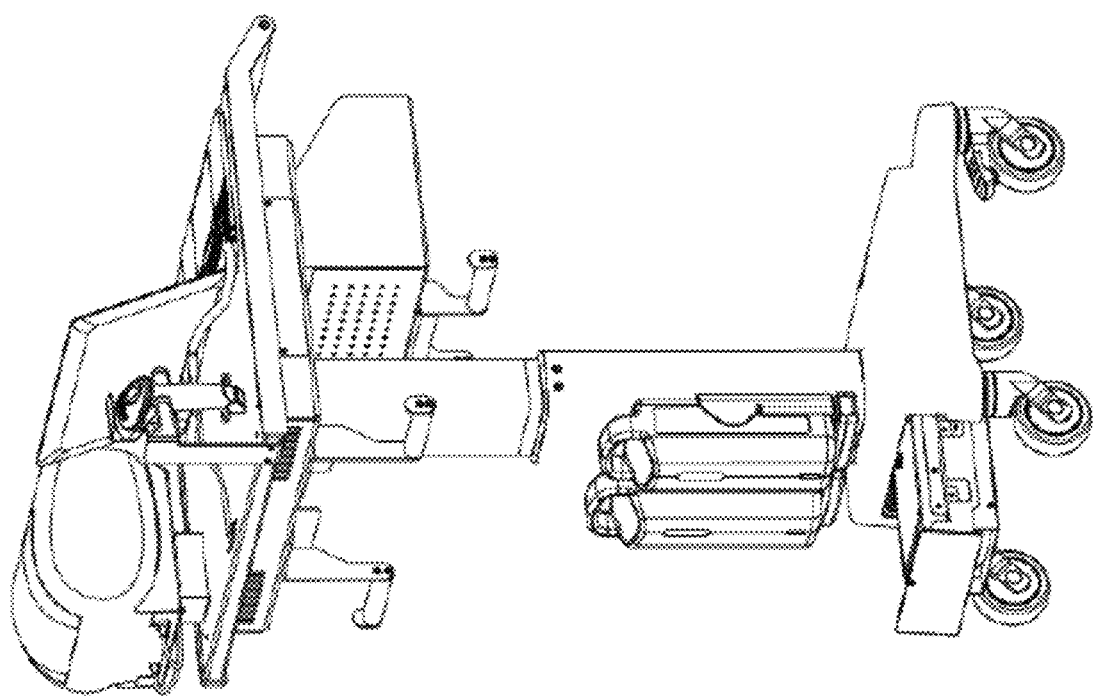
FIG. 2 illustrates the current state of the art, a battery powered workstation cart with a non-mobile battery in the base.

FIG. 2 illustrates the current version of a mobile battery powered workstation cart having a non-mobile battery in the base. This current non-mobile battery may be replaced with a mobile swappable battery 100 as disclosed herein, having a wheeled housing 102 and a handle 110, to increase ease of battery swapping efficiency for users of a powered workstation.

Figure 4:
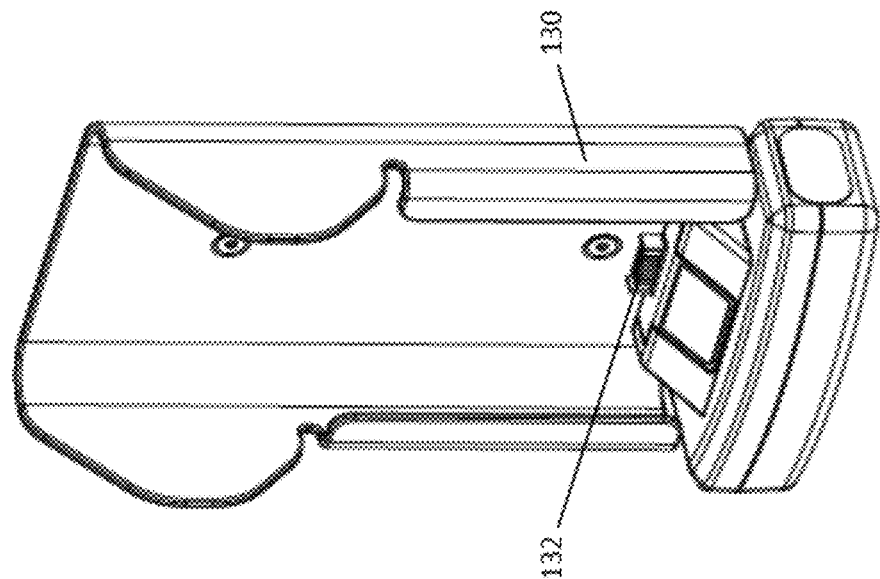
FIG. 4 illustrates an exemplary battery docking/connector without a battery coupled thereto, showing the exposed battery connection contacts thereon.
Figure 3:
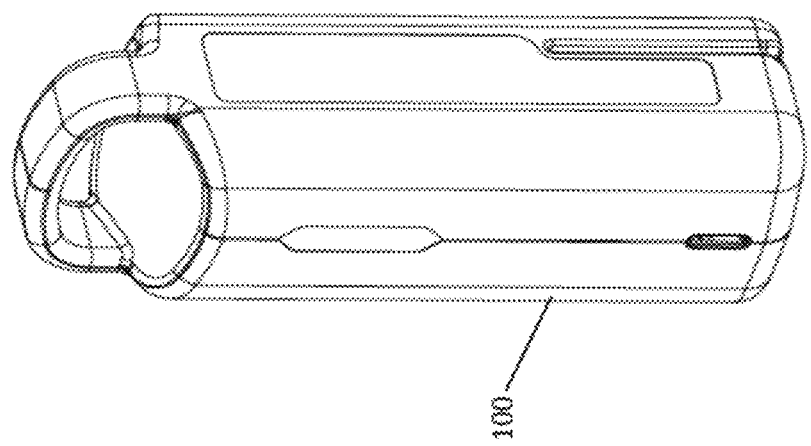
FIG. 3 illustrates an exemplary battery, such as a mobile swappable battery.

FIG. 3 illustrates an exemplary battery 100 and FIG. 4 illustrates an exemplary battery docking/connector 130 without a battery 100 coupled thereto to better illustrate the exposed battery connection contact 132 thereon. These exposed battery connection contacts 132 may be found within the battery guide 122 in the base of a powered workstation 120.

FIG. 5 illustrates an exemplary battery 100 (such as a mobile swappable battery) being pushed into proper alignment with battery docking/connector 130 and approaching contact with exposed battery connection contacts 132. FIG. 6 illustrates an exemplary battery 100 (such as a mobile swappable battery) properly coupled to battery docking/ connector 130, such as may be found within a battery guide 122 in the base of a powered workstation 120 of the present invention. FIGS. 7 and 8 illustrate the exposed battery connection contacts 132 and the underlying printed circuit board 134 coupled thereto.

Figure 9:
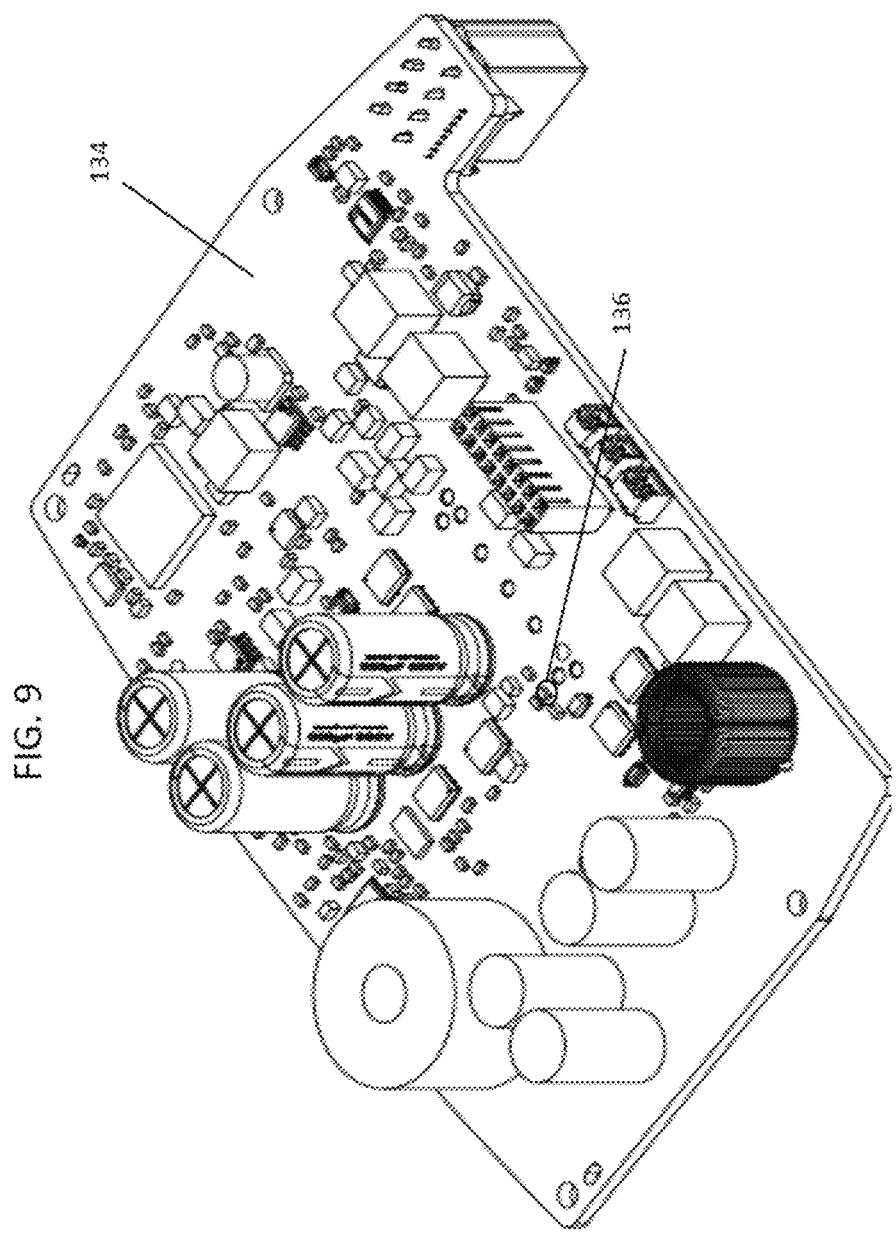
FIGS. 9 and 10 illustrate the circuit sensor positioned on the printed circuit board of the battery docking/connector.
Figure 10:
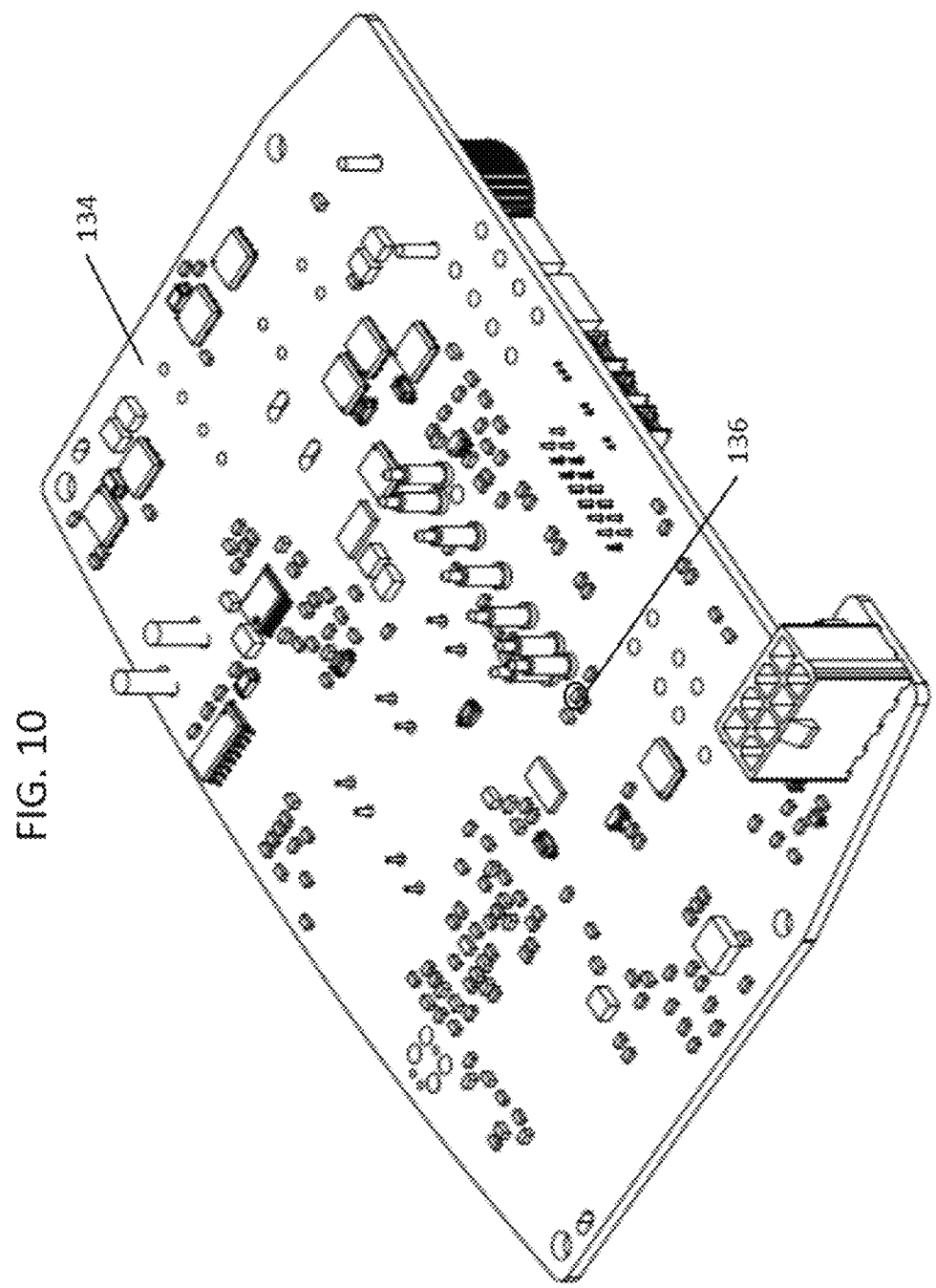

FIGS. 9 and 10 illustrate an optional embodiment comprising a circuit sensor 136 positioned on the printed circuit board 134 to monitor the temperature. It is important to monitor the temperature at the exposed battery connection contacts 132, because if they become obstructed or damaged, such as by dirt or liquids, they may overheat and eventually destroy the battery 100 and/or the battery connection system. Additionally, if the battery 100 or its exposed contacts are not properly positioned in relation to the battery docking/connector 130 and its exposed battery connection contacts 132, the battery 100 may also overheat and eventually destroy the battery 100 and/or the connection system. It would thus be desirable, to monitor the temperature at the exposed battery connection contacts 132 to prevent overheating and eventual damage to the system. In order to monitor the temperature of the exposed battery connection contacts 132, an optional circuit sensor 136 (shown and circled in FIGS. 9 and 10) may be positioned on the printed circuit board 134 (such as at positions R259, R260, for example) to monitor the temperature. The optional circuit sensor 136 may comprise a thermal sensor, thermocouple, temperature sensor, and/or thermistor, for example.

The optional circuit sensor 136, shown in FIGS. 9 and 10, may sense or detect the temperature and shut the battery connection system down should the temperature rise too high, thus saving the battery 100 and/or connection system from permanent damage. The circuit sensor 136 may operate by switching off the electrical load to the battery 100 and/or the exposed battery connection contacts 132 once a predetermined threshold temperature has been reached. By switching off the electrical load to the battery 100 and/or the exposed battery connection contacts 132, the battery 100 and/or connection system can be turned off before overheating to prevent permanent damage. In this embodiment, a user or operator may be alerted, such as by receiving an error message, that the exposed battery connection contacts 132 need to be cleaned (or the battery 100 needs to be repositioned) before proceeding. It should be understood that the circuit sensor 139 may be added to the battery docking/connector 130 within the base of a powered workstation 120, as an optional feature, but in some cases, it may not be included.

Figure 13:
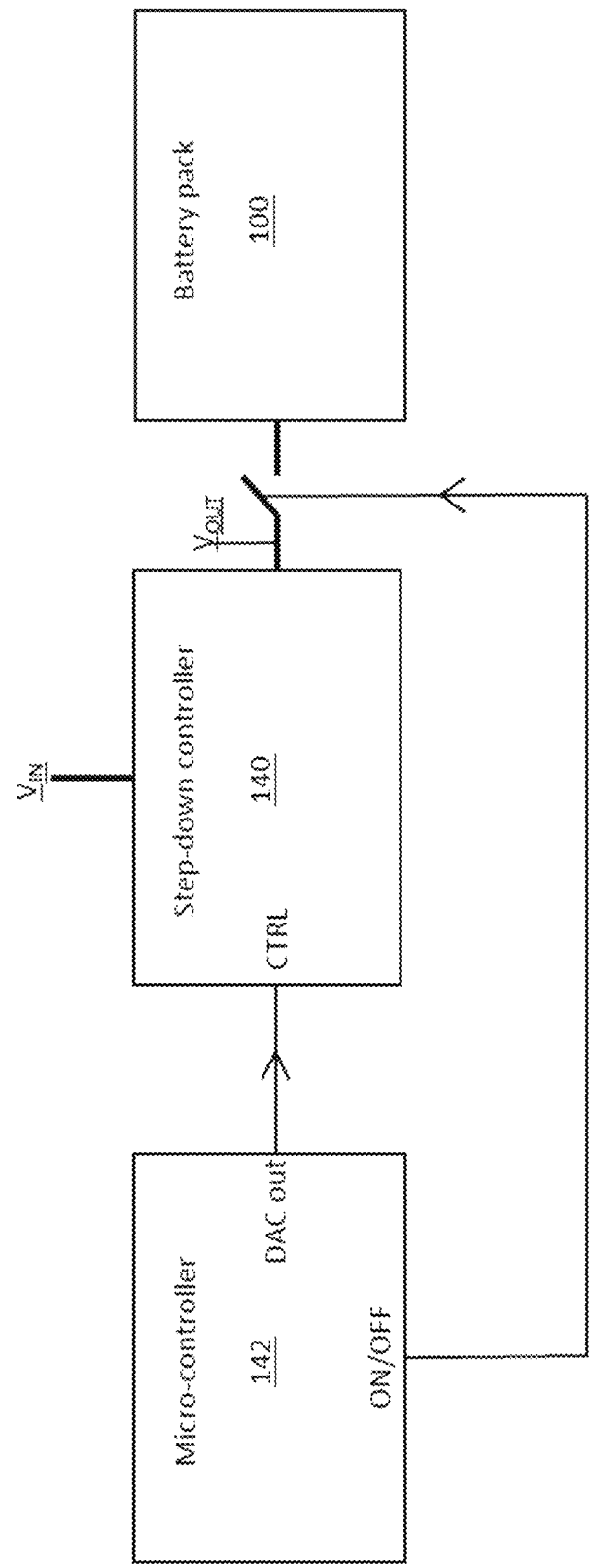
FIG. 13 illustrates the electrical relationship between the microcontroller, step down controller, and battery.

In another embodiment, as shown in FIG. 13, there may be a first predetermined "threshold" temperature to reduce battery current, and a second predetermined "cutoff threshold" temperature to completely cutoff battery current. The predetermined "threshold" and "cutoff threshold" temperatures may be calculated or preset by a user and/or may be altered by a user, such as by changing programming of microcontroller 142. It should also be understood that the predetermined "threshold" and "cutoff threshold" temperatures may vary depending upon the type, size, and number of batteries used and the overall battery usage of a particular system.

As shown in FIG. 13, the step down controller 140 is electrically coupled to both the battery 100 (to charge the battery 100) and to microcontroller 142. The battery charger current is set by analog voltage on the CTRL pin of the step down controller 140. The DAC (Digital to Analog Converter) pin of the microcontroller 142 is used to set the analog voltage to control the current to desired value/level. When temperature of the battery (measured at battery pins) crosses the first predetermined "threshold" temperature, then the microcontroller 142 reduces the DAC voltage, which in turn reduces the battery 100 charging current. However, if the temperature continues to rise and the temperature crosses the second predetermined higher "cutoff threshold" temperature, then the microcontroller 142 turns off the current to the battery 100 entirely (to prevent damage by overheating). In another embodiment, during battery 100 charging and/or operation, if the temperature crosses the first predetermined "threshold" temperature, then battery 100 charging current may be reduced, such as by firmware and/or by a step down controller 140 via current reduction to microcontroller 142, for example. If the temperature then rises further and crosses the second predetermined "cutoff threshold" temperature, then the battery 100 charging current may be switched off entirely, such as by the microcontroller 142, for example. In this embodiment, a user or operator may also be alerted, such as by receiving an error or alert message, that the battery 100 needs to be repositioned, or battery connection contacts 132 need to be cleaned, before proceeding.

Figure 11:
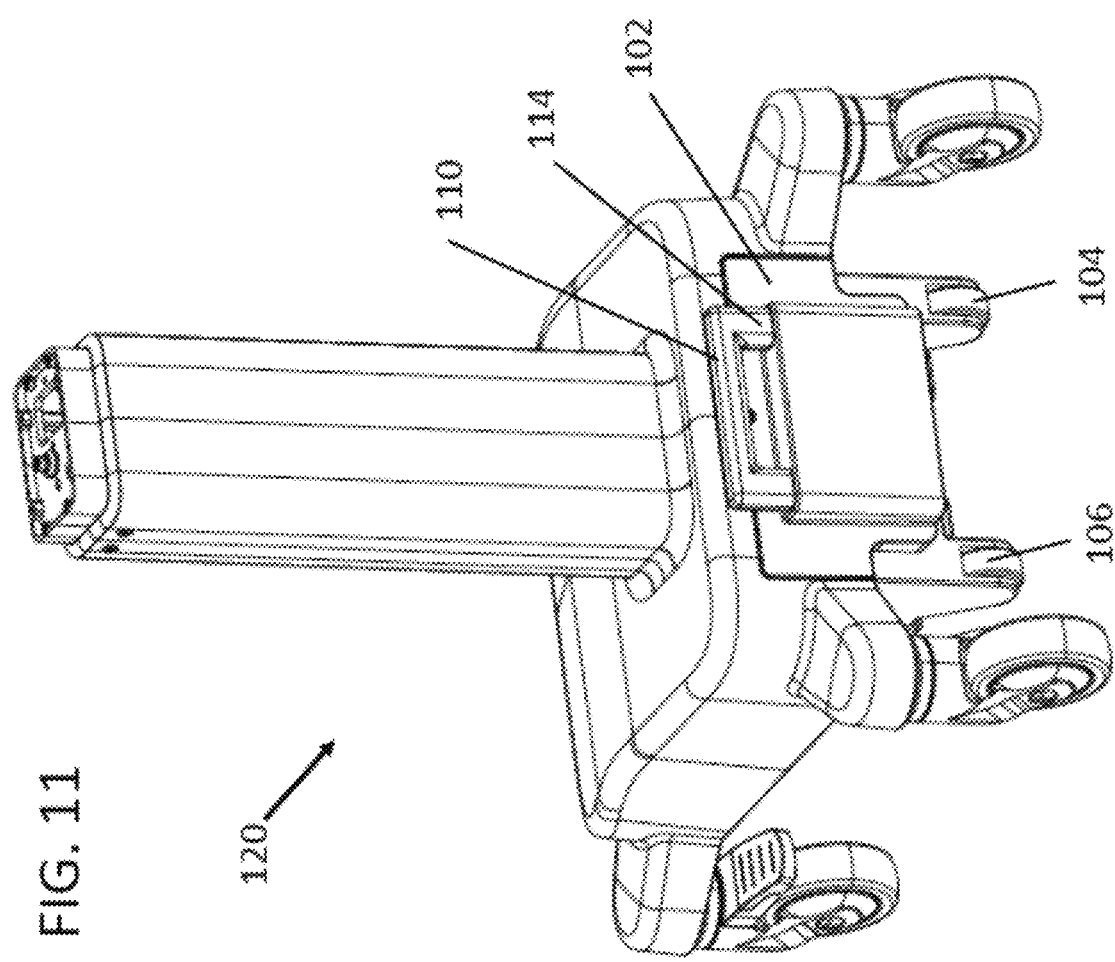
FIG. 11 illustrates an exemplary rendering of a mobile swappable battery properly coupled with the base of a powered workstation cart.
Figure 12:
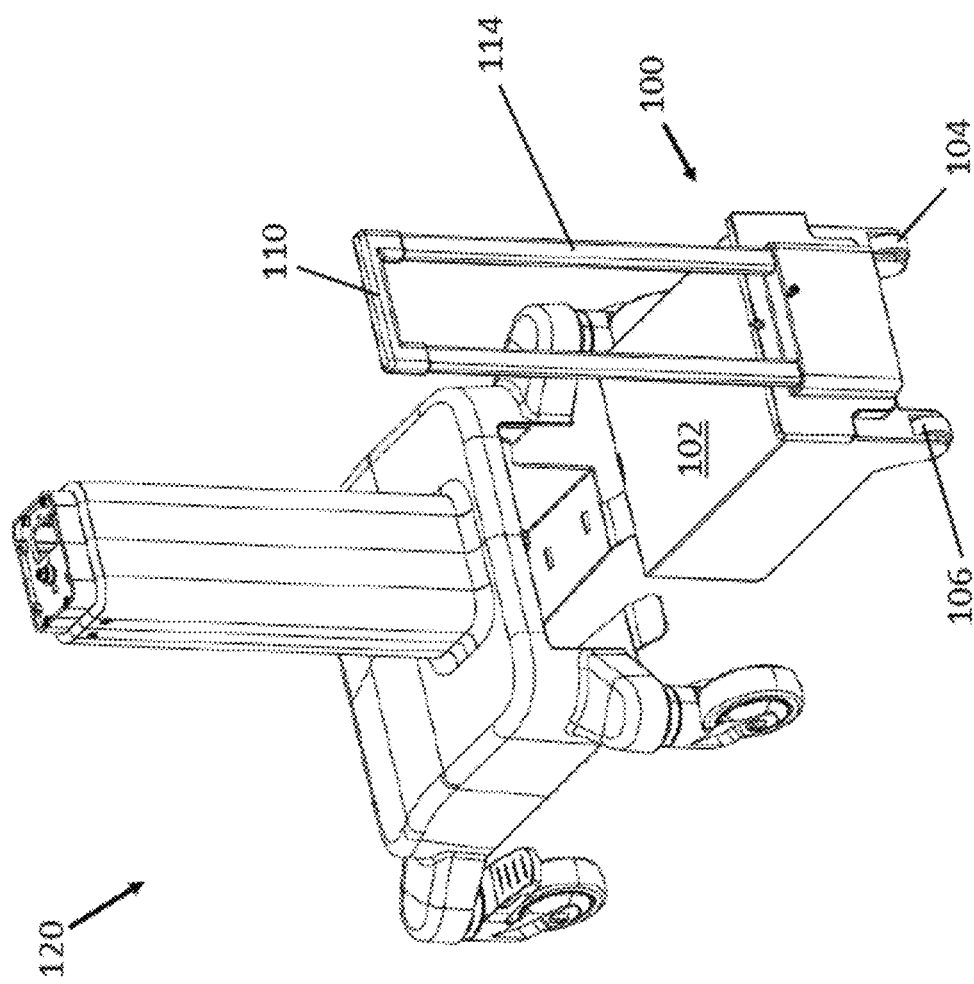
FIG. 12 illustrates an exemplary rendering of a mobile swappable battery being wheeled or rolled into proper alignment with a battery guide in the base of a powered workstation.

FIG. 11 illustrates an exemplary rendering of a mobile swappable battery 100 wheeled or rolled (via wheels 104, 106, and 108) into the base of a powered workstation cart 120. FIG. 12 illustrates an exemplary rendering of a mobile swappable battery 100 being wheeled or rolled into proper alignment with battery guide 122 in the base of the powered workstation 120.

While various embodiments of devices and systems and methods for using the same have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:
1. A mobile swappable battery sized for coupling with a base of a powered workstation, comprising:
   a wheeled housing enclosing a portion of the mobile swappable battery and comprising wheels attached to a bottom side of the wheeled housing so the wheeled housing rolls along the ground when pushed;
   the wheels sized so the mobile swappable battery is of appropriate height to align with a battery guide in the base of the powered workstation; and
   wherein the wheeled housing and wheels are configured to be rolled along the ground to enter the base of the powered workstation to electrically couple the mobile swappable battery to a battery connection contact within the base of the powered workstation without needing to lift the mobile swappable battery as the mobile swappable battery is already at the appropriate height and can just be pushed and guided into proper alignment with the battery guide.

2. The mobile swappable battery of claim 1, further comprising an electrical contact element unenclosed by the wheeled housing.

3. The mobile swappable battery of claim 2, wherein the electrical contact element couples to the battery connection contact in the base of the powered workstation when the mobile swappable battery and the powered workstation are electrically coupled.

4. The mobile swappable battery of claim 1, wherein the mobile swappable battery is configured to lock into position in the base of the powered workstation so that the mobile swappable battery cannot become loose or lose electrical connectivity from the powered workstation during operation.

5. The mobile swappable battery of claim 1, further comprising a handle for guiding the mobile swappable battery into the base of the powered workstation.

6. The mobile swappable battery of claim 5, wherein the handle is collapsible.

7. The mobile swappable battery of claim 6, wherein the handle is collapsed down into the wheeled housing when in a collapsed state.

8. The mobile swappable battery of claim 6, wherein the handle extends above the wheeled housing when in a collapsed state.

9. A mobile swappable battery sized for detachable coupling with a base of a powered workstation, comprising:
a wheeled housing enclosing a portion of the mobile swappable battery, wherein the wheeled housing comprises:
at least one wheel attached to a bottom side of the wheeled housing so the wheeled housing rolls along the ground when pushed;
the at least one wheel sized so the mobile swappable battery is of appropriate height to align with a battery guide in the base of the powered workstation; and
a handle for guiding the wheeled housing into alignment with the base of the powered workstation; and
wherein the wheeled housing and the at least one wheel are configured so that the wheeled housing rolls along the ground to enter the base of the powered workstation to electrically couple the mobile swappable battery to a battery connection contact within the base of the powered workstation without needing to lift the mobile swappable battery as the mobile swappable battery is already at the appropriate height and can just be pushed and guided into proper alignment with the battery guide.

10. The mobile swappable battery of claim 9, wherein the at least one wheel is a front wheel configured to swivel 360 degrees.

11. The mobile swappable battery of claim 9, designed to lock into the battery guide so that it cannot become loose or lose electrical connectivity from the powered workstation during operation.

12. The mobile swappable battery of claim 9, wherein the mobile swappable battery comprises an exposed electrical contact element that electrically couples to the battery connection contact in the base of the powered workstation.

13. The mobile swappable battery of claim 9, wherein the handle extends upward from wheeled housing.

14. The mobile swappable battery of claim 9, wherein the handle is formed of collapsible segments.

15. A system for a powered workstation with a swappable battery, comprising:
a powered workstation having a battery guide at a base of the powered workstation, the battery guide sized to fit a mobile swappable battery;
the mobile swappable battery comprising a handle for guiding the mobile swappable battery into the battery guide;
the mobile swappable battery further comprising a wheeled housing and wheels attached to a bottom side of the wheeled housing so the wheeled housing rolls along the ground when pushed; and
the wheels sized so the mobile swappable battery is of appropriate height to align with the battery guide in the base of the powered workstation; and
wherein the wheeled housing is configured so that the mobile swappable battery can slide into the battery guide and electrically connect to the powered workstation while the wheeled housing rolls along the ground without needing to lift the mobile swappable battery as the mobile swappable battery is already at the appropriate height and can just be pushed and guided into proper alignment with the battery guide.

16. The system for a powered workstation with a swappable battery of claim 15, wherein the mobile swappable battery is designed to lock into the battery guide so that it cannot become loose or lose electrical connectivity from the powered workstation during operation.

17. The system for a powered workstation with a swappable battery of claim 16, further comprising a mechanical locking mechanism to lock the mobile swappable battery into the battery guide.

18. The system for a powered workstation with a swappable battery of claim 16, further comprising an electrical mechanical locking mechanism to lock the mobile swappable battery into the battery guide.

19. The system for a powered workstation with a swappable battery of claim 15, further comprising a non-mobile battery in the base of the powered workstation, wherein the non-mobile battery may be replaced with the mobile swappable battery.

* * * * *